(12) United States Patent
Sedberry

(10) Patent No.: US 6,553,662 B2
(45) Date of Patent: Apr. 29, 2003

(54) METHOD OF MAKING A HIGH-DENSITY ELECTRONIC CIRCUIT

(75) Inventor: Donald C. Sedberry, North Wales, PA (US)

(73) Assignee: Max Levy Autograph, Inc., Philadelphia, PA (US)

( * ) Notice: Subject to any disclaimer, the term of this patent is extended or adjusted under 35 U.S.C. 154(b) by 28 days.

(21) Appl. No.: 09/899,507

(22) Filed: Jul. 3, 2001

(65) Prior Publication Data

US 2003/0006067 A1 Jan. 9, 2003

(51) Int. Cl.$^7$ ................................. H01K 3/00
(52) U.S. Cl. ...................... 29/849; 29/846; 29/848
(58) Field of Search ..................... 29/846, 898, 831, 29/849, 825; 156/901

(56) References Cited

U.S. PATENT DOCUMENTS

| | | | |
|---|---|---|---|
| 5,194,698 A | * | 3/1993 | Souto et al. |
| 5,334,279 A | * | 8/1994 | Gregoire |
| 5,390,412 A | * | 2/1995 | Gregoire |
| 5,451,722 A | * | 9/1995 | Gregoire |
| 5,514,451 A | | 5/1996 | Kumar et al. |
| 5,565,262 A | | 10/1996 | Azzaro et al. |
| 5,581,876 A | | 12/1996 | Prabhu et al. |
| 5,653,834 A | | 8/1997 | Azzaro et al. |
| 5,681,444 A | | 10/1997 | Azzaro et al. |
| 5,725,808 A | | 3/1998 | Tormey et al. |
| 5,747,931 A | | 5/1998 | Riddle et al. |
| 5,847,935 A | | 12/1998 | Thaler et al. |
| 5,858,145 A | | 1/1999 | Sreeram et al. |
| 5,866,240 A | | 2/1999 | Prabhu et al. |
| 5,876,536 A | | 3/1999 | Kumar et al. |
| 5,925,203 A | | 7/1999 | Riddle et al. |
| 5,929,510 A | | 7/1999 | Geller et al. |
| 5,953,203 A | | 9/1999 | Tormey et al. |
| 5,958,807 A | | 9/1999 | Kumar et al. |
| 6,011,330 A | | 1/2000 | Goodman et al. |
| 6,017,642 A | | 1/2000 | Kumar et al. |
| 6,055,151 A | | 4/2000 | Tormey et al. |
| 6,230,402 B1 | * | 5/2001 | Sexton et al. |
| 6,361,702 B1 | * | 3/2002 | Grear |

* cited by examiner

Primary Examiner—Carl J. Arbes
(74) Attorney, Agent, or Firm—Williiam H. Eilberg

(57) ABSTRACT

A high-density circuit has a plurality of conductors formed in grooves in a ceramic substrate, the conductors having a height less than that of the walls of the grooves. The substrate is embossed with a pattern of grooves corresponding to the grooves in an electroform made from a master tool. The same master tool is used to form a stencil which mates with the grooved substrate. A cermet paste is pushed through the stencil, so as to fill the bottom region of the grooves, and the stencil is then removed, leaving only the paste at the bottom of the grooves. The substrate is then fired, causing the substrate to harden, and causing the cermet to become conductive and to become firmly bonded to the substrate. Because the stencil and the substrate are made from the same, or replications of the same, master tool, the cermet paste can be laid down with great precision, thus enhancing the quality of the product, and reducing the cost of its manufacture.

23 Claims, 19 Drawing Sheets

Cross-section of the Master with a photo-resist coat being applied Collimated light.

Cross-section of the Master after being developed. The photo-resist is left over where it was not exposed to the light.

METHOD OF MAKING A HIGH-DENSITY ELECTRONIC CIRCUIT

BACKGROUND OF THE INVENTION

This invention relates to the field of high-density electronic circuits which are embedded in insulating materials such as ceramics. The invention has applications in any field in which it is necessary to provide closely-spaced conductors in a three-dimensional insulating substrate.

One area in which the present invention is useful is in the manufacture of plasma displays. In a plasma display, front and back panels define a chamber which contains a gas. The front panel is clear, and the back panel has a plurality of closely-spaced conductors, arranged in a matrix. By applying suitable voltages to selected conductors, certain regions of the gas are ionized to become a plasma, and are induced to generate light. An optical filter placed near the front panel determines the color of the light as seen by an outside observer.

The preferred structure for the back panel is an insulating substrate that has conductors arranged in grooves formed in the substrate. Because the voltages needed to generate the plasma are high, it is important to isolate each conductor from its neighbors, to avoid the risk of arcing.

The method known in the prior art, for making insulating substrates having grooves containing conductive material, is to screen print the conductive material onto a flat surface of unfired ceramic material, and then to press the conductive material into the unfired ceramic. The pressure forms grooves in the ceramic, and the conductive material is forced into these grooves.

A major problem with the technique described above is that it cannot be practiced with precision when the density of conductors is high. It is very difficult to achieve precise alignment between the screened pattern of lines of conductive material, and the embossing die used to embed the conductive material in the ceramic. Typically, under the best circumstances, steel wire screens can be accurately registered and sized to no better than plus or minus 0.001 inches (25 microns) per ten inches of span. For a 20-inch workpiece, the latter tolerance means that there may be an error of at least plus or minus 0.002 inches (50 microns). Since the pitch of a typical pattern of conductors is 165 microns, and the grooves are typically 110 microns wide at their bottoms, the screen mask itself takes up all of the allowable tolerance. The latter does not allow for any process variations in the embossed parts.

The process described above is also likely to result in an "overflow" of conductive material within the grooves formed in the ceramic substrate. The conductive material, when pressed into the unfired ceramic, tends to diffuse the conductive material and cause it to flow up over the side wall of the groove, instead of being laid down at the bottom of the groove. The latter effect causes a problem, especially where high voltages are to be applied to the conductors, because electric current is more likely to arc from one conductor to another when the conductors fill the grooves, or when they spill out beyond the grooves. If too much conductive material is present, it is even possible to have short circuits between conductors. Thus, it is desirable, and often necessary, for the conductive material to occupy only the bottom regions of the grooves, to insure maximum electrical isolation between adjacent conductors.

Apart from the problem of possible short circuits, the process of the prior art tends to produce conductors having non-uniform thicknesses, and thus the resistivity of the circuit is increased. The longer the circuit paths and the more closely-spaced the conductors, the more severe the resistivity problem becomes.

In the above-described procedures, the material embedded in the grooves is preferably a conductive cermet material. A cermet is a material containing particles of metal dispersed in a ceramic carrier. Initially, the cermet may take the form of a paste. When fired at high temperatures, the metal particles melt and fuse together, so that the metal particles become an integral electrical conductor which remains conductive when cooled. In this specification, the term "conductive cermet" will be used to identify the cermet paste, although it should be understood that the material does not actually become conductive until it has been fired. Examples of such cermet materials are given in U.S. Pat. No. 4,897,676, the disclosure of which is incorporated by reference herein.

The present invention provides a practical and precise method of forming closely-spaced conductors embedded in an insulating substrate. The present invention makes it possible to embed conductive cermet in very closely-spaced grooves, without wasting appreciable cermet. The product made by this process is of such higher quality than comparable circuits of the prior art, that it is possible to use less expensive materials as conductors, without any reduction in the level of performance.

SUMMARY OF THE INVENTION

In one aspect, the present invention comprises a method of making a three-dimensional high-density circuit. In this method, one first provides a master tool having walls and grooves which define a desired circuit pattern. Next, one creates an electroform, by electroplating over the master tool, the electroform having a plurality of tongues and grooves which correspond to the grooves and walls of the master tool. Then, one presses the electroform into an unfired ceramic substrate, to form a pattern of grooves and walls in the substrate.

Next, one places a stencil over the substrate, the stencil having a plurality of U-shaped members which mate neatly with the walls formed in the substrate. It is an important feature of the invention that the stencil is made from the same master tool as the electroform, or from a replication thereof, so that the pattern defined by the U-shaped members will be the same as the pattern of walls and grooves in the substrate.

One then applies a cermet paste over the stencil, forcing the paste through spaces between adjacent U-shaped members, until the paste fills the space at the bottom of the grooves of the substrate. The U-shaped members are sized such that their side walls do not extend to the bottom of the grooves of the substrate, so the paste can fill the space near the bottom.

The stencil, with cermet paste remaining between the U-shaped members, is then removed from the substrate, leaving the paste at the bottom of each of the grooves. The substrate can then be fired in a conventional manner.

Another aspect of the invention is the method of making the stencil described above. The stencil is made by electroforming material over the master tool. Before the electroforming begins, one coats the master tool with a photoresist. The master tool is exposed to collimated light, which exposes only the photoresist on the tops and walls of the grooves in the tool, but leaves the photoresist at the bottom of the grooves unexposed. After chemical development, the exposed photoresist is dissolved away, but the photoresist at the bottom of the grooves remains. Since the photoresist is non-conductive, no electroplating occurs at the bottom of the grooves. Thus, the electroforming process results in material that surrounds the walls of the master tool, but does not extend to the bottom of the walls. In short, the material formed has the shape of a plurality of U-shaped members, the U-shaped members having side walls which are not as long as the depth of the grooves in the final product.

In the preferred embodiment, in the manufacture of the stencil, before the electroforming takes place, one places a plurality of stainless steel wires across the walls of the master tool. The wires becomes embedded in the electroformed material, and give it rigidity. Also, the electroforming process produces bridge sections, integral with the U-shaped members, which hold the U-shaped members together, making the stencil a one-piece object.

After the electroforming is complete, the tops of the U-shaped members are lapped down to remove excess electroformed material. The result is a stencil which mates perfectly with a grooved substrate formed from the same master tool.

Another aspect of the present invention is the high-density circuit made by the method described above. This circuit is a ceramic substrate having walls and grooves, and in which a conductive material is located at the bottom of at least some of the grooves. The grooves define circuit lines having a density which can be about 10 to about 200 lines per inch. The height of the conductive material in the grooves is preferably in the range of 0.1–0.6 times the height of the wall. Thus, the walls of the grooves are substantially higher than the height of the conductors. This arrangement enhances the isolation of the conductors from each other.

The present invention therefore has the primary object of providing a high-density electronic circuit.

The invention has the further object of providing a method for making a high-density electronic circuit.

The invention has the further object of reducing the cost of making a high-density electronic circuit.

The invention has the further object of improving the accuracy with which one can make a high-density electronic circuit.

The invention has the further object of providing a high-density electronic circuit in which the conductors have uniform thickness, and reduced resistivity.

The invention has the further object of providing a high-density electronic circuit, which circuit can be used at high voltages without arcing.

The reader skilled in the art will recognize other objects and advantages of the present invention, from a reading of the following brief description of the drawings, the detailed description of the invention, and the appended claims.

BRIEF DESCRIPTION OF THE DRAWINGS

FIG. 3a provides a top view of a stencil used in applying a conductive cermet to a ceramic substrate, in making a product according to the present invention, FIG. 3b provides an end view of the stencil of FIG. 3a.

DETAILED DESCRIPTION OF THE INVENTION

The present invention is a method for making a high-density electronic circuit, and the circuit produced by that method. The circuit is formed in an insulating substrate having grooves in which the conductors are embedded.

The method of the present invention begins with copper master tool 1, shown in FIG. 1. The copper master tool includes walls 2 which define grooves 3. The master tool is made by conventional means which do not form part of the present invention, and which are known to those skilled in the art. The pattern of grooves 3 corresponds to the pattern of conductors of the electronic circuit desired to be manufactured.

Figure 1B:
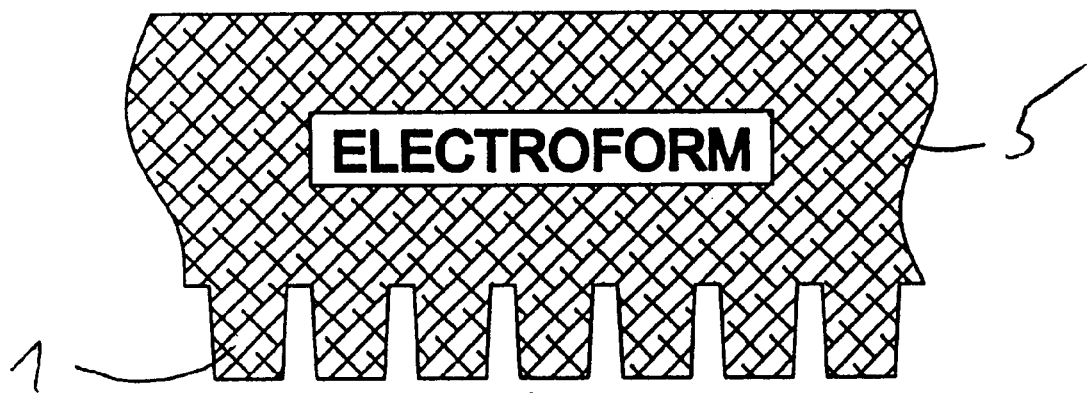
FIG. 1b provides a fragmentary cross-sectional view of an electroform made from the copper master tool of FIG. 1a, used in making a product according to the present invention.
Figure 1A:
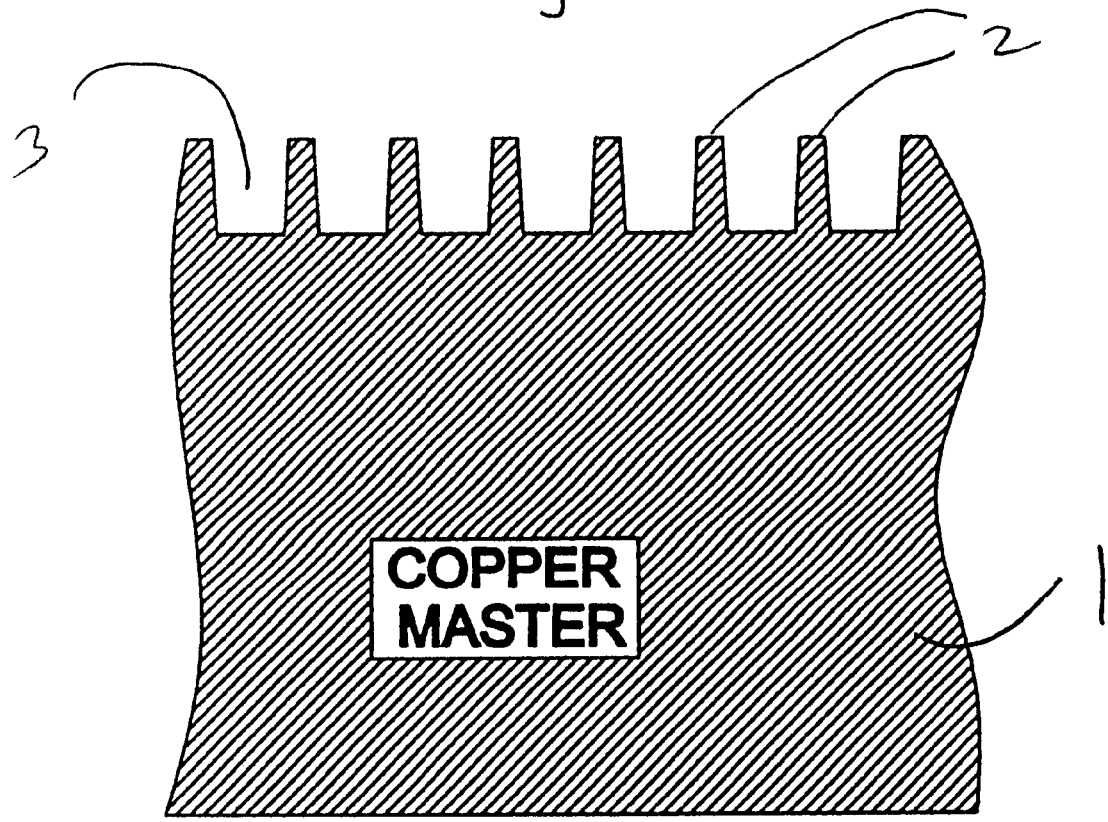
FIG. 1a provides a fragmentary cross-sectional view of a copper master tool used in making a product according to the present invention.

The copper master tool is used to create electroform 5, shown in FIG. 1b. Electroform 5 is preferably made of nickel, and is produced by electroplating nickel onto the copper master tool. When enough nickel has accumulated on the master tool, the nickel is removed. The accumulated mass of nickel defines the electroform. Due to the shape of the master tool, the electroform has a plurality of tongues 7 which correspond to the grooves 3 of the master tool. The technique of electroplating is wellknown, and the details of the electroplating process do not form part of the present invention.

Figure 2A:
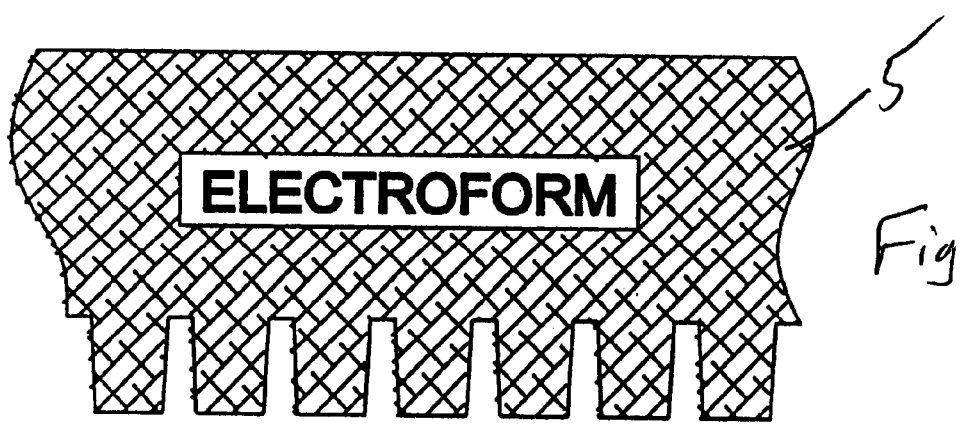
FIGS. 2a and 2b provide fragmentary cross-sectional views of the electroform and a ceramic substrate, the electroform being used to impress a pattern of grooves in the substrate, in making a product according to the present invention.
Figure 2B:
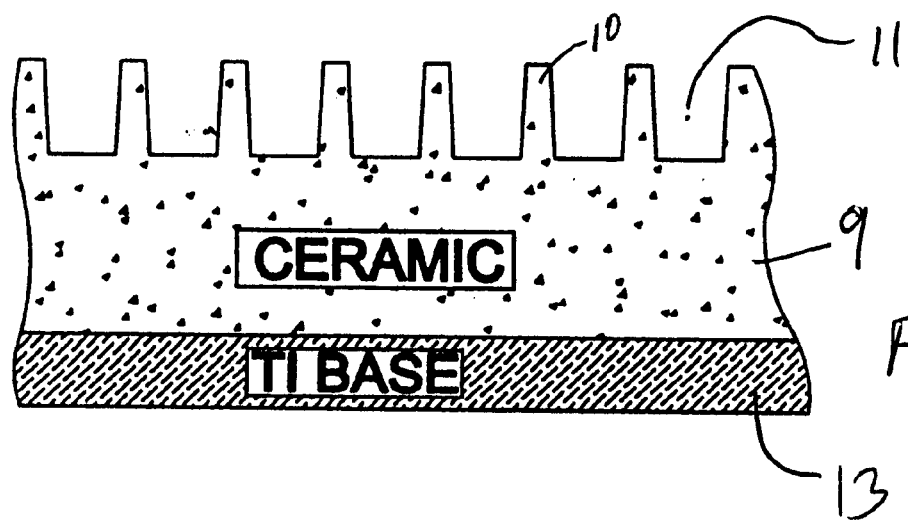

FIGS. 2a and 2b illustrate the next step of the process of the present invention. Electroform 5 of FIG. 2a, which is the same as the electroform shown in FIG. 1b, is pressed against ceramic substrate 9 shown in FIG. 2b, to form grooves 11 in the ceramic. The grooves 11 are separated by walls 10. The ceramic substrate is shown attached to a base 13, preferably made of titanium. Since the electroform was made from the copper master tool, it follows that the pattern of grooves in the ceramic is essentially identical to the pattern of grooves in the copper master tool.

Figures 3A, 3B:
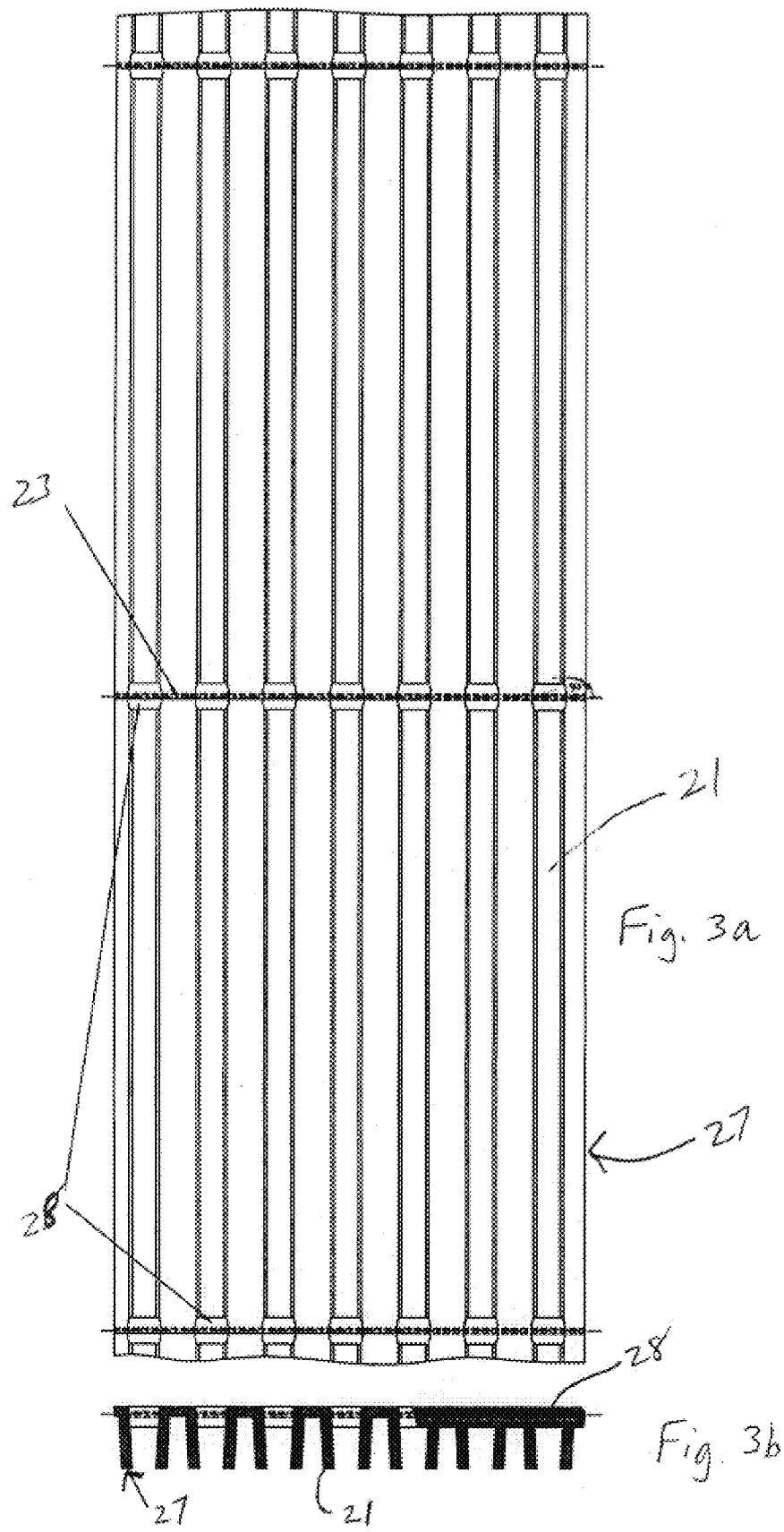

The next step comprises the use of a stencil 27, illustrated in FIGS. 3a and 3b. The stencil comprises a plurality of elongated U-shaped members 21, held together as a unit by support wires 23 and bridge sections 28. The stencil is preferably constructed by electroforming, as will be described later, and is formed from the copper master tool 1 of FIG. 1a. That is, the U-shaped members mate with the walls of the copper master tool. As shown in FIG. 3b, the U-shaped members are joined not only by the wires, but are also integral with the bridge sections 28, which are, by definition, made of the same material used to form the U-shaped members.

It is an important feature of the present invention that the electroform 5 and the stencil 27 be formed either directly or from replications made from the same master tool. The position of each U-shaped member is such that it fits snugly around a corresponding wall 2 of the copper master tool, but does not extend all the way to the bottom of that wall.

The end view of FIG. 3b shows how each U-shaped member fits neatly over a corresponding wall 2 of the copper master tool.

Figure 4B:
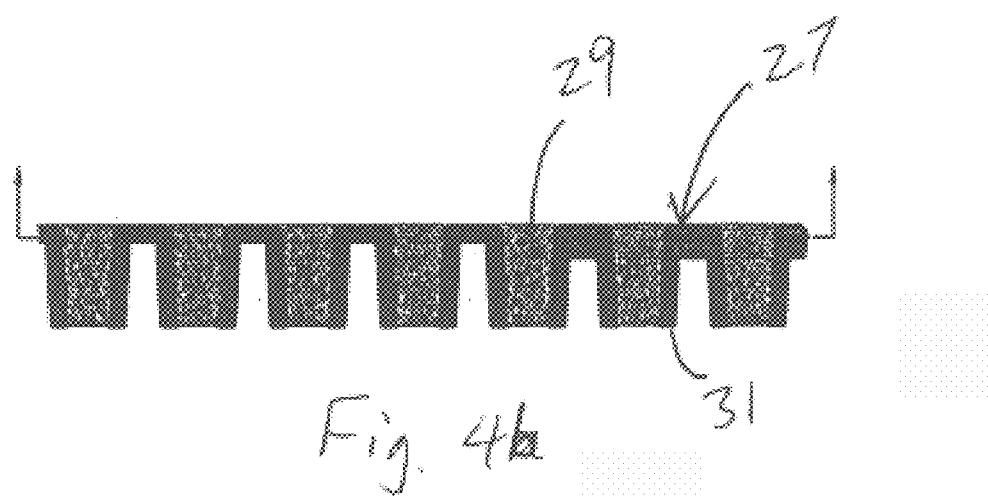
FIG. 4b provides a cross-sectional view of the stencil of FIG. 3a carrying cermet material, after it has been withdrawn from the ceramic substrate.
Figure 4A:
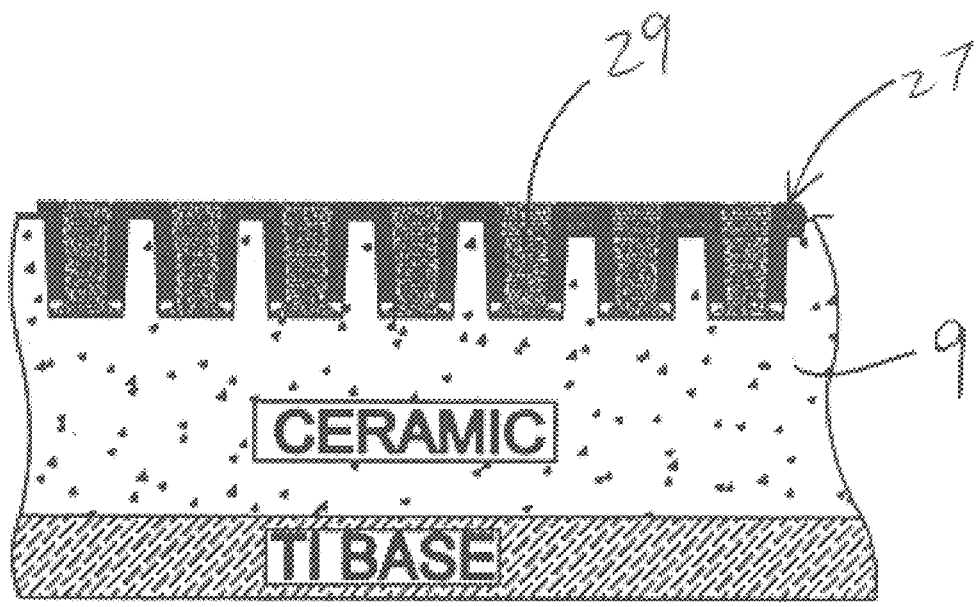
FIG. 4a provides a fragmentary cross-sectional view of the stencil of FIG. 3a inserted into grooves in the ceramic substrate, in making a product according to the present invention.

Next, the stencil is inserted, in mating relationship, into the ceramic substrate 9, as best shown in FIG. 4a. Each of the grooves 11 in the ceramic substrate corresponds to the space between corresponding U-shaped members.

Each U-shaped member fits neatly over one of the walls 10 of the grooves in the ceramic substrate, but does not extend to the bottom of the wall.

With the stencil and the ceramic substrate engaged with each other, one applies a conductive cermet to the top of the stencil. The conductive cermet initially takes the form of a paste which can be easily extruded through the stencil. The fact that the U-shaped member does not extend to the bottom of the wall of the groove is an important feature. It means that the region at the bottom of each groove 11 of the ceramic substrate will be completely filled with cermet paste, and the paste at the bottom of the groove will extend from one wall of the groove to the next. This arrangement helps to insure that when the stencil is pulled away from the substrate, the cermet paste is broken off at the bottom 31 of the U-shaped member, leaving a deposit of cermet material at the bottom of each groove.

Figure 4C:
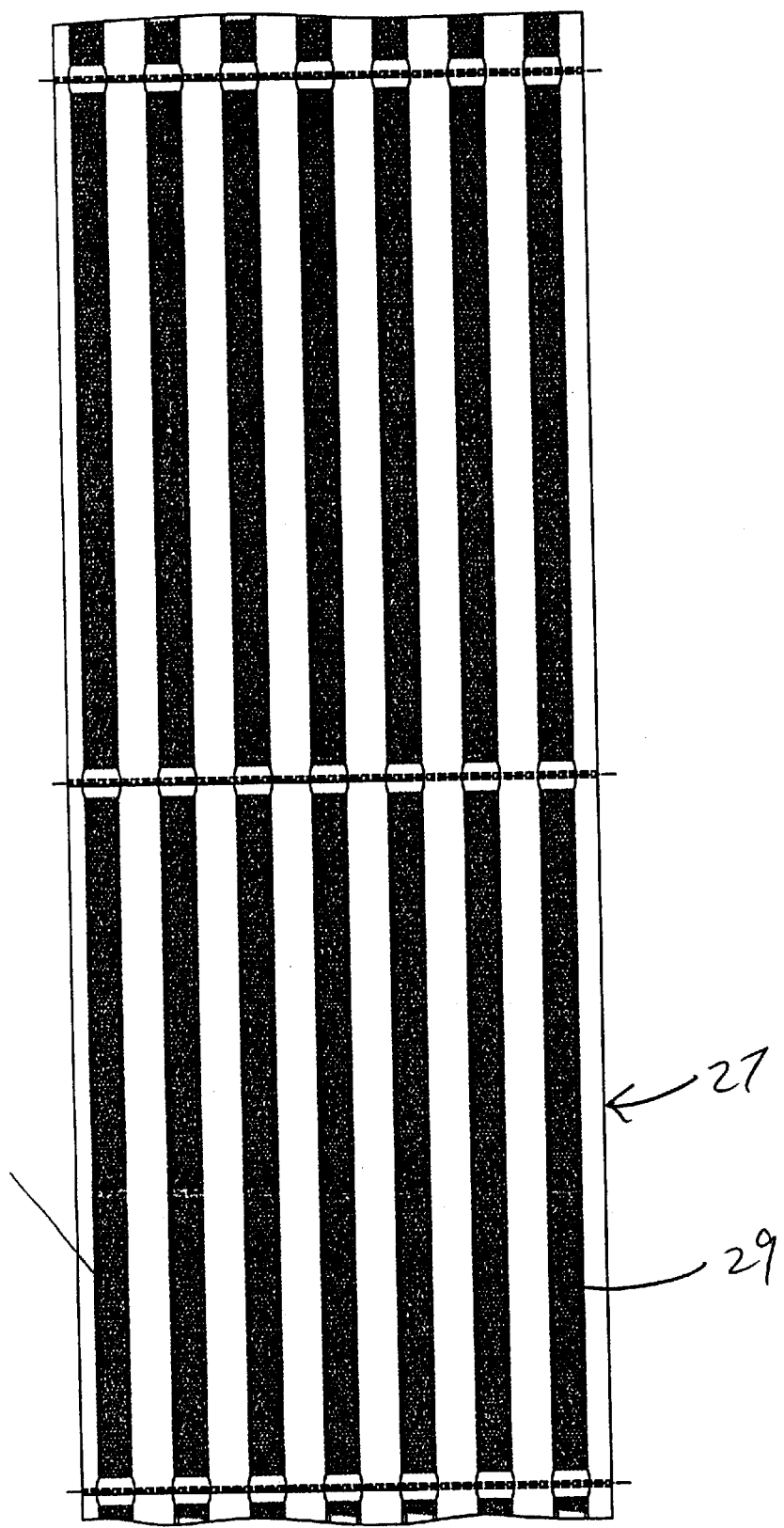
FIG. 4c provides a top view of the stencil of FIG. 4b, showing the stencil filled with cermet material.

FIG. 4c provides a top view of the stencil after it has been filled with cermet material 29. The cross-sectional view of FIG. 4a also clearly shows the cermet material 29 that fills substantially all of the available space in the grooves of the ceramic substrate. The cermet is made to fill this space simply by applying more and more cermet material, until no more material can be pushed into the available space.

Next, the stencil is removed from the substrate. Due to surface tension between the cermet paste and the U-shaped member, the cermet paste remains in the spaces between adjacent U-shaped members when the stencil is lifted from the ceramic substrate. That is, the cohesive force at the bottom of the grooves is greater than that of the cermet paste at the bottom of the stencil, where the cross-section is less than that of the conductor width. The angle of the side wall also prevents all of the cermet from leaving the stencil. The result is a clean break at the bottom.

Clearly, the thickness of the cermet remaining in the grooves is controlled by determining the length of the side walls of the U-shaped members. This length therefore ultimately determines the thickness of the conductors forming the circuit to be produced. The shorter the side walls of the U-shaped member, the thicker the deposit, and vice versa.

The result of the above-described process is a grooved ceramic substrate in which a cermet material is deposited at the bottom of each groove, at a known thickness.

All of the above steps are performed on an uncured ceramic substrate. After the cermet material has been deposited, the substrate is fired, using known techniques, both to cure and harden the ceramic, and to cause the cermet material to become conductive, and to become permanently bonded to the ceramic.

The stencil can be used again, simply by inserting it into another ceramic substrate, and pushing more cermet material, from the top of the stencil, into the grooves of the substrate.

Figure 5:
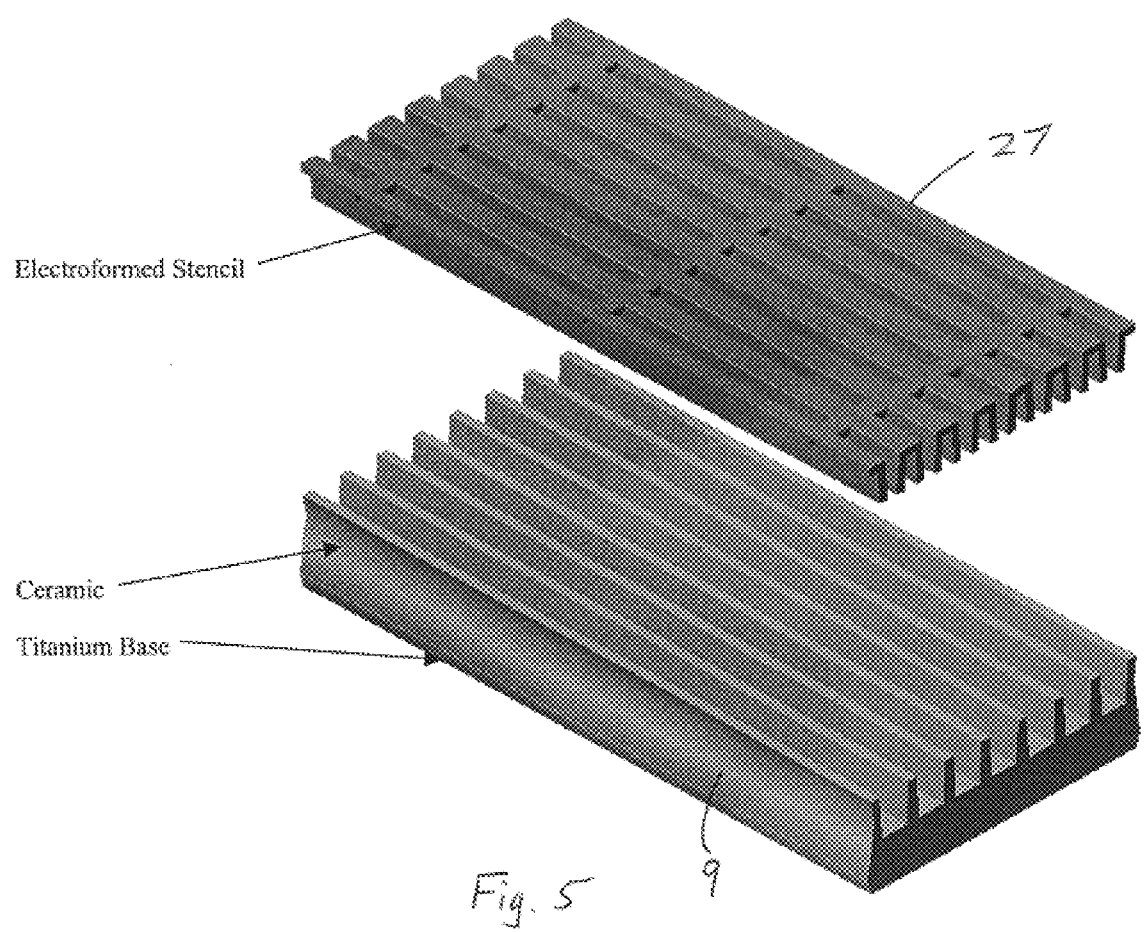
FIG. 5 provides a perspective view showing the stencil and ceramic substrate used in making a product according to the present invention.
Figure 6:
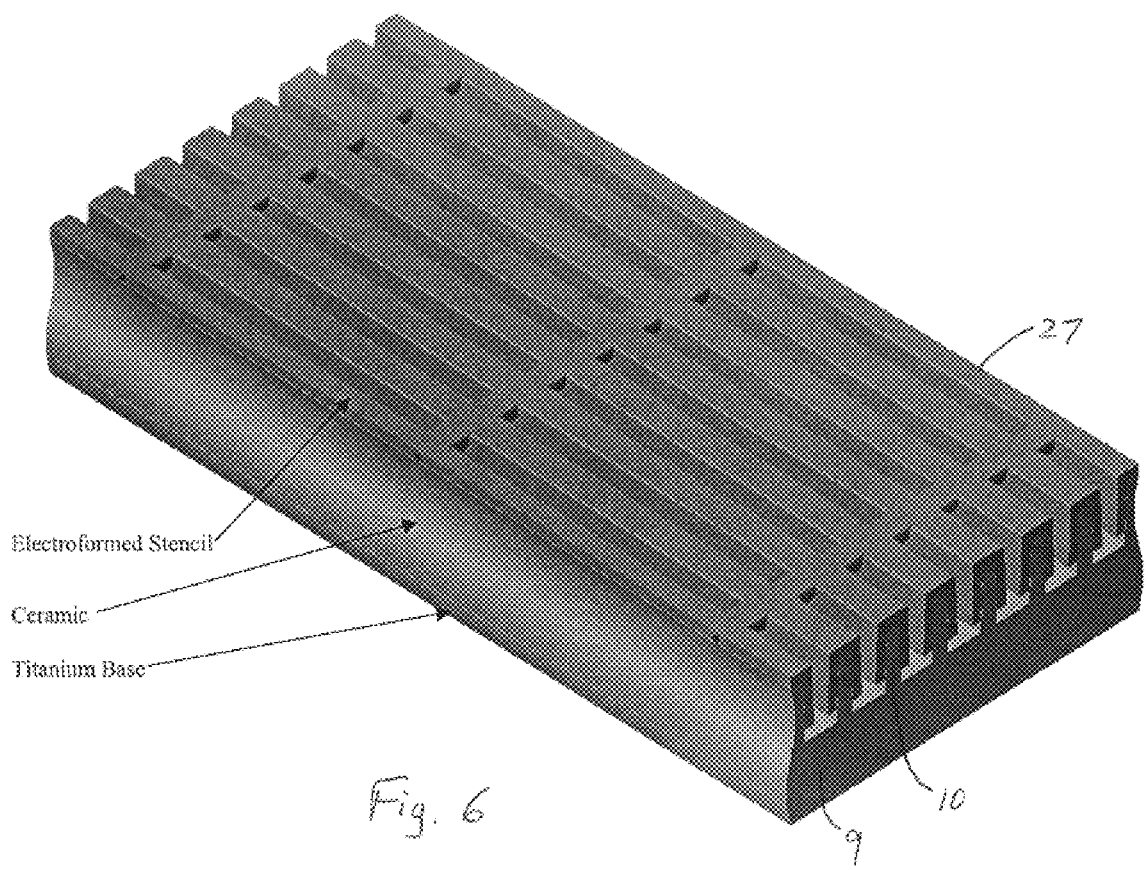
FIG. 6 provides a perspective view of the stencil and the substrate in mating relationship.

FIGS. 5–12 provide perspective views which summarize the use of the stencil, as described above, to form the circuit of the present invention. In FIG. 5, the stencil 27 is aligned over the ceramic substrate 9, so that the two components can be mated. In FIG. 6, the stencil and the substrate have been fully mated. FIG. 6 clearly shows how each U-shaped member of the stencil fits snugly around each of the walls 10 defining the grooves in the ceramic substrate. The figure also clearly shows that the U-shaped members do not extend all the way to the bottom of the grooves.

Figure 7:
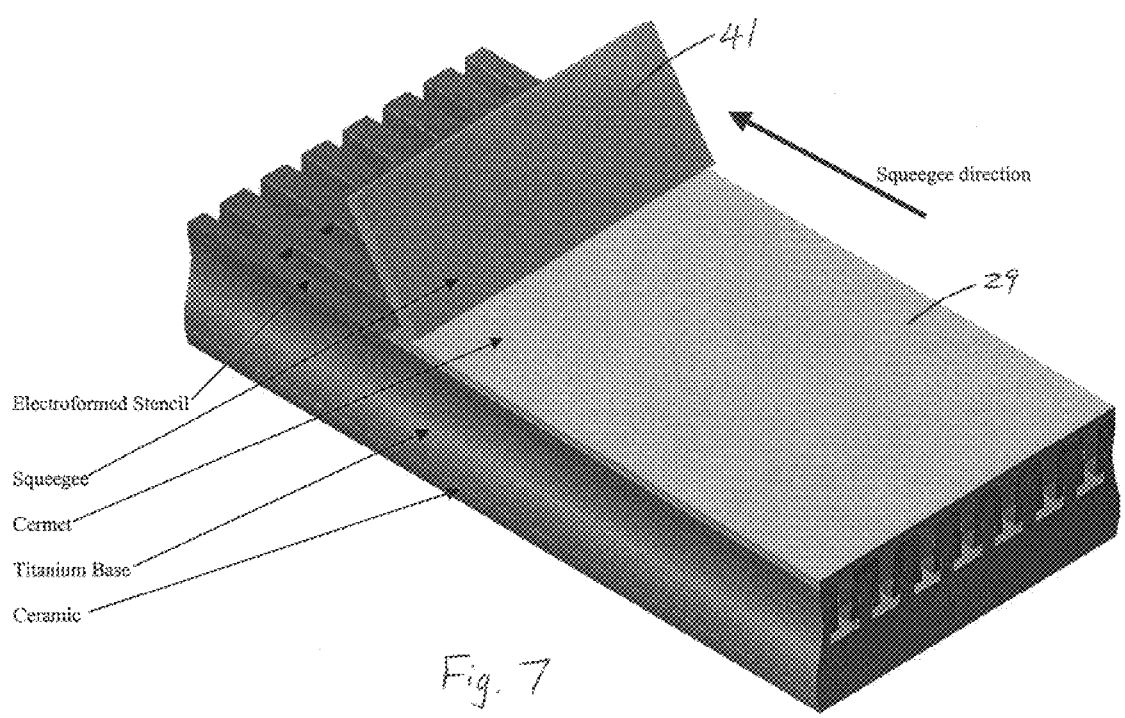
FIG. 7 provides a perspective view illustrating the process of applying conductive cermet material to the stencil.
Figure 8:
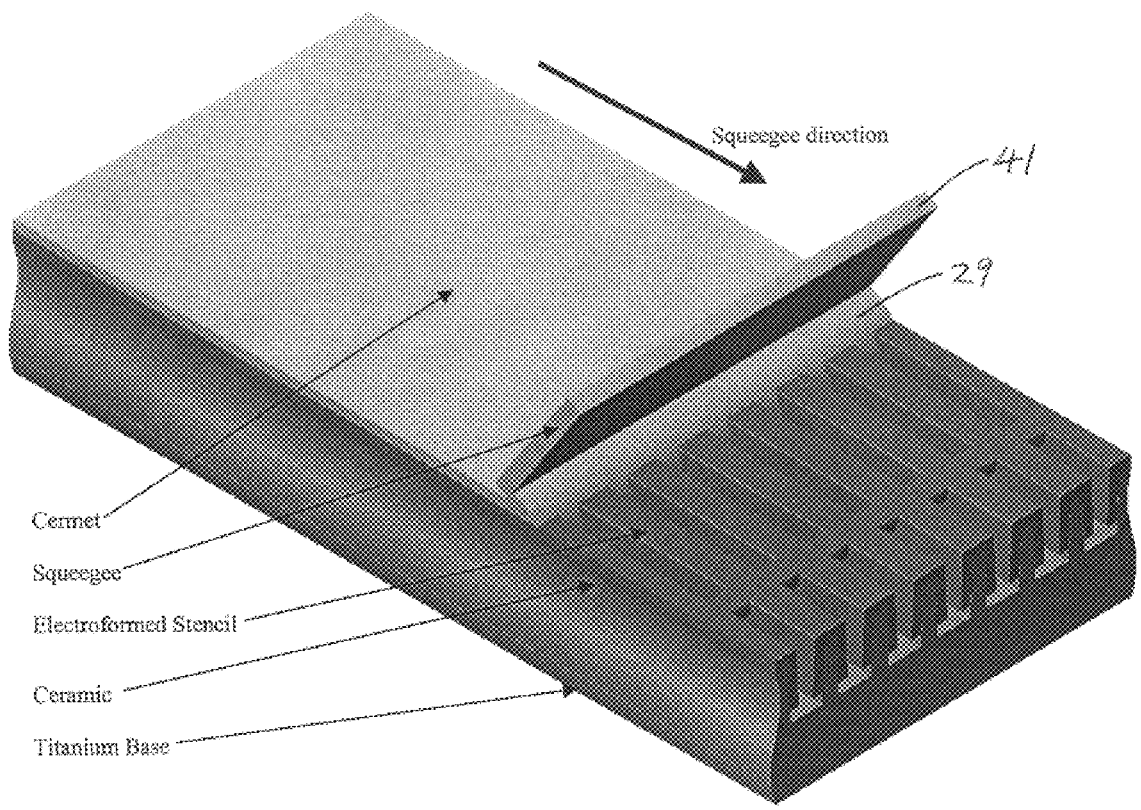
FIG. 8 provides a perspective view from the rear of FIG. 7.

FIGS. 7 and 8 illustrate the application of cermet material to the stencil. The cermet paste 29 can be applied with a squeegee 41. When enough paste has been applied, it will fill all of the available spaces in the grooves, except for the space occupied by the U-shaped members. FIG. 8 shows a rear view of what is shown in FIG. 7.

Figure 9:
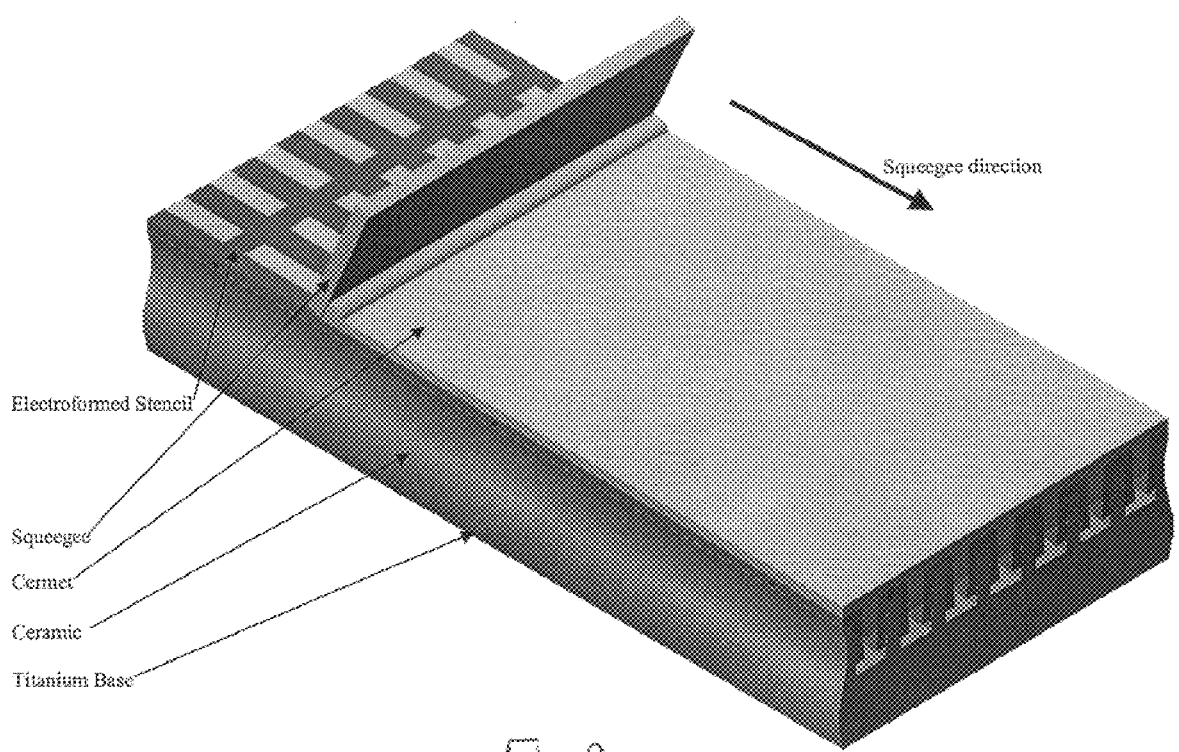
FIG. 9 provides a perspective view of the process of forcing the cermet material through the stencil and into the bottom of the grooves in the ceramic substrate as well as skiving the leftover cermet material from the top of the stencil.
Figure 10:
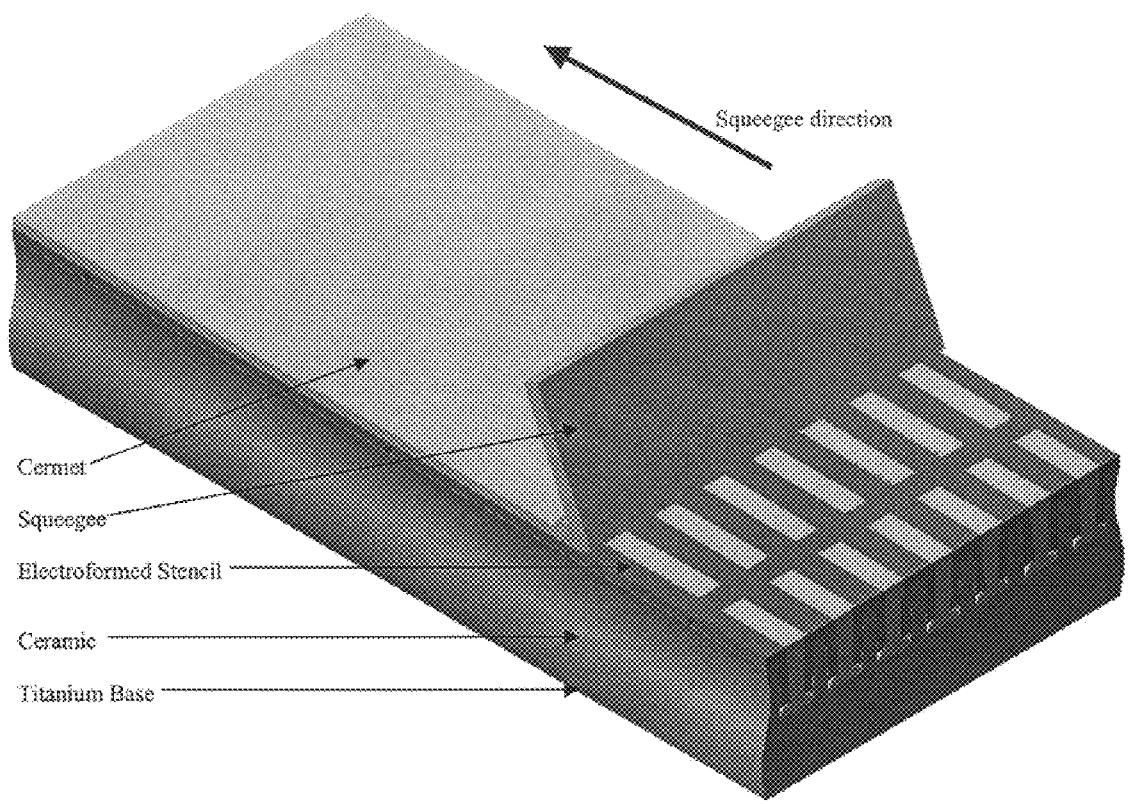
FIG. 10 provides a perspective view from the rear of FIG. 9.
Figure 11:
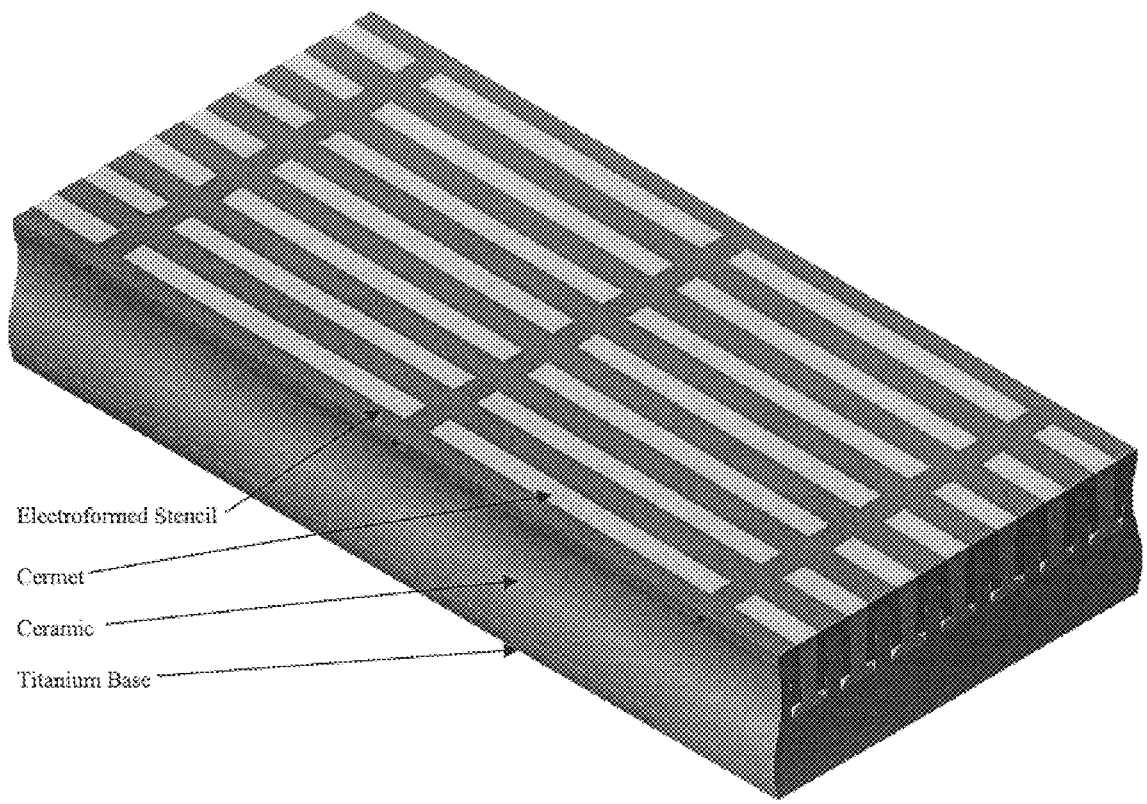
FIG. 11 provides a perspective view of the stencil and substrate, wherein cermet has been squeezed into the grooves and all excess cermet material has been removed.

When the grooves have been filled with cermet paste, the squeegee is drawn back across the stencil, forcing the paste down into the bottom of the grooves in the ceramic substrate, and filling all of the available space with cermet. The excess paste is also skived off the top of the stencil during this cermet transfer process, as shown in FIGS. 9 and 10. FIG. 10 shows the rear view corresponding to FIG. 9. FIG. 11 shows the mated stencil and substrate with the grooves completely filled with cermet paste, and wherein all excess cermet paste has been removed.

Figure 12:
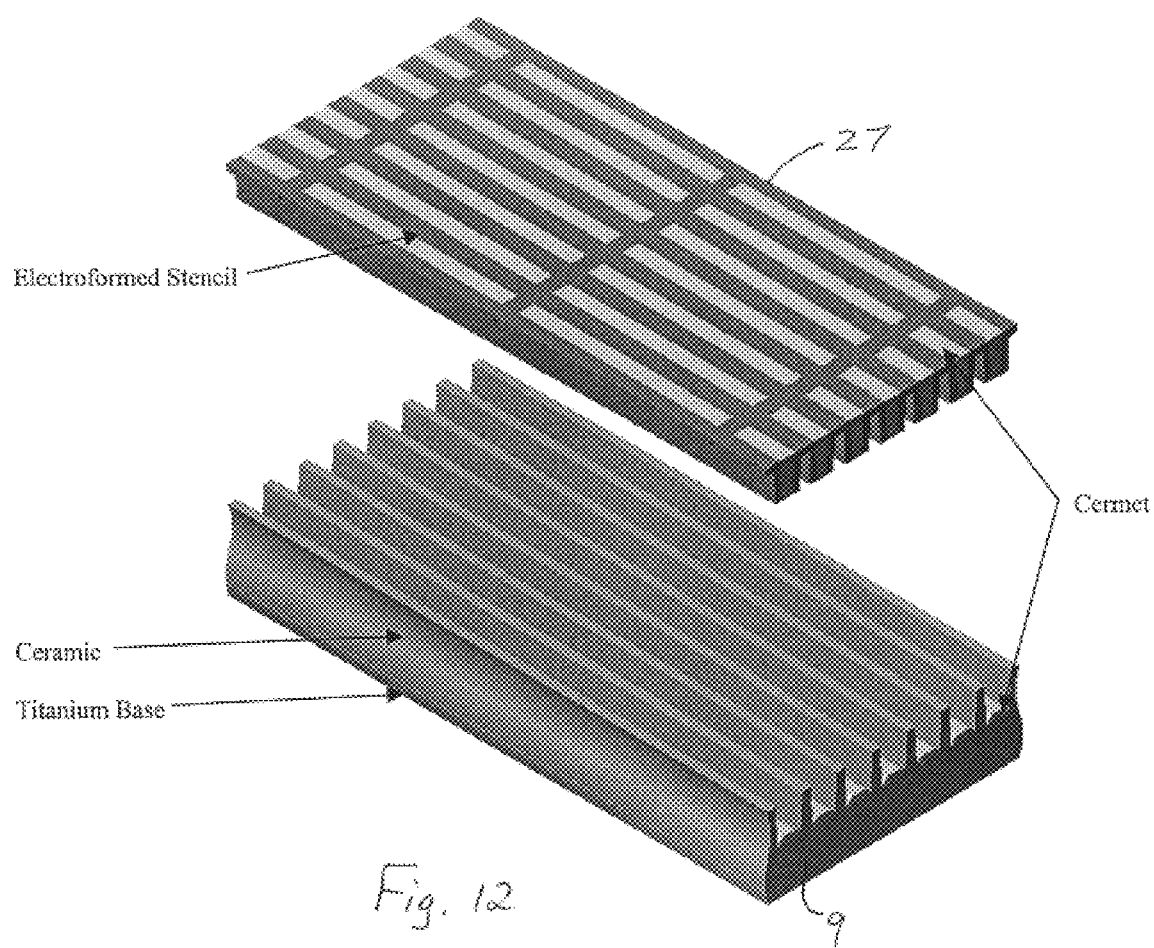
FIG. 12 provides a perspective view showing the removal of the stencil from the substrate, leaving a substrate having conductive cermet material in the grooves.

FIG. 12 shows the removal of the stencil 27 from the substrate. After this step, cermet paste remains at the bottom of each groove in the substrate, as well as between the U-shaped members of the stencil. Due to the open structure of the stencil, it is easy to replenish the supply of cermet paste, simply by applying more paste to the top of the stencil and extruding it through the spaces between the U-shaped members.

Figure 13:
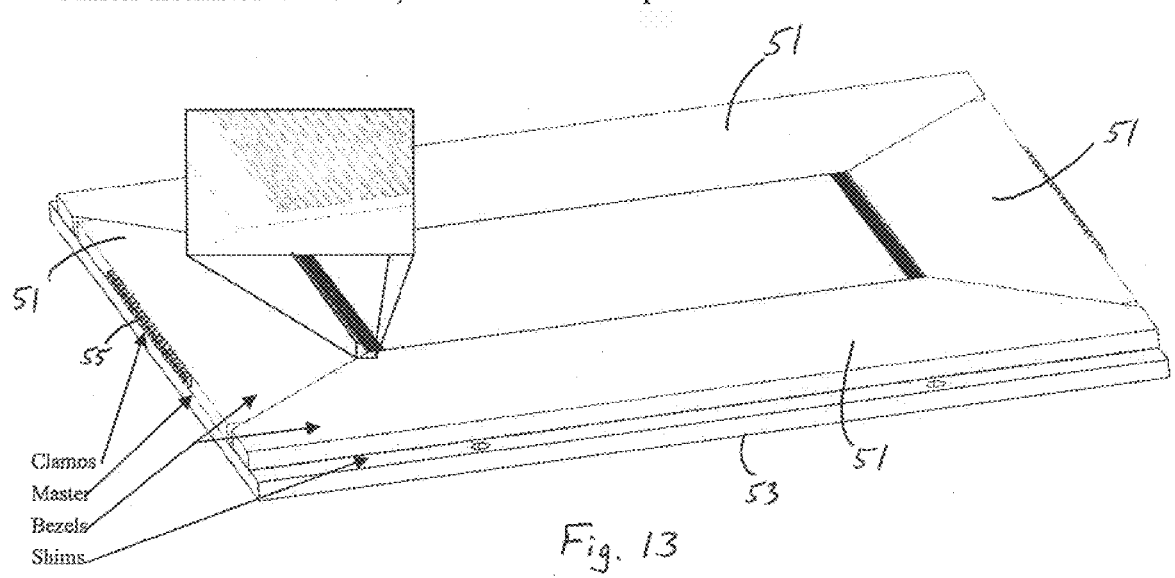
FIG. 13 provides a perspective view of the master tool assembled with bezels, shims and wire clamps, in a first step in the manufacture of the stencil used in the present invention.

FIGS. 13–18 illustrate the process of making the stencil used in the present invention. First, the master tool is assembled with bezels and shims, as shown in FIG. 13. The master tool 53 comprises a base, and a raised central portion which is surrounded by bezels 51. Shims are placed between the base of the master tool and the bezels, to adjust the height of the bezels so as to create a level top surface. The central portion of the master tool is what contains the grooves and walls defining the circuit. Clamps 55 are placed at opposite edges of the assembly, to hold the wires that will be used in forming the stencil.

The master tool is coated with a photoresist. The photoresist is preferably applied by dip coating, and the resulting coating is typically about 25 microns thick. The invention is not limited to a particular thickness, however. After dip coating, the photoresist covers all of the walls and grooves of the master tool.

It is an important aspect of the present invention that the photoresist is applied with a controlled thickness. The thickness of the photoresist ultimately determines the length of the side walls of the U-shaped members of the stencil, and thus determines the height of the conductors to be formed in the substrate. One can increase the thickness of the photoresist by adjustments to the dip coating process. The preferred method of increasing the thickness is by increasing the rate at which the tool is withdrawn from the tank, and by increasing the viscosity of the photoresist. The faster one pulls the tool out, the thicker the coating, as the coating has less time to drain off while in contact with the photoresist in the tank.

Figure 14:
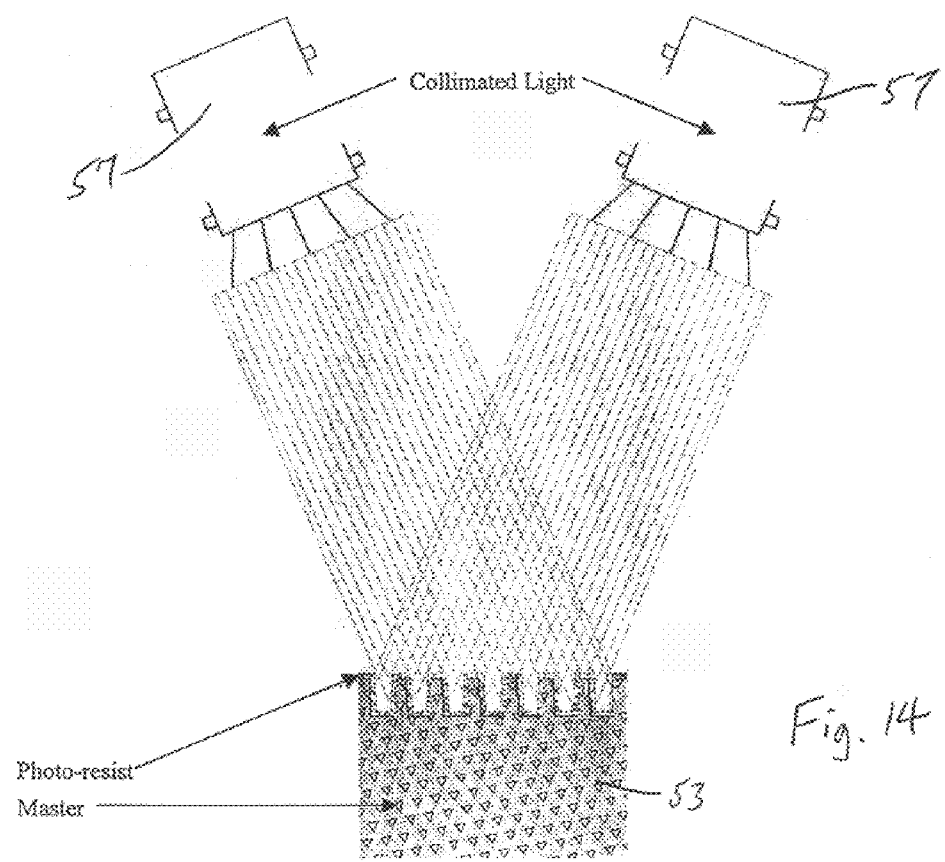
FIG. 14 is a schematic diagram showing the use of collimated light to expose a photoresist applied to a master tool, in the manufacture of the stencil of the present invention.

The coated master tool 53 is then exposed to collimated light, produced by light sources 57, as shown schematically in FIG. 14. The light sources are positioned at an angle such that only the tops and sides of the walls are exposed to the light. No light reaches the bottom of the grooves. It is always possible to find an angle which will expose the master tool in this way.

Figure 15:
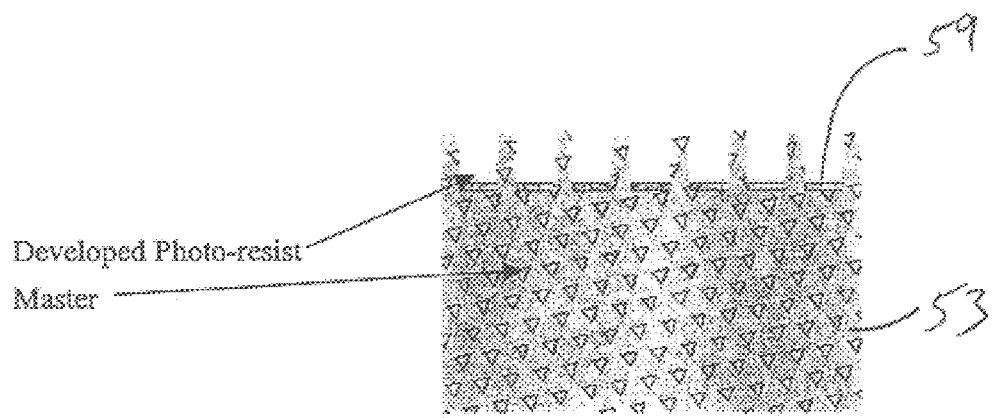
FIG. 15 is a cross-sectional view of part of the master tool, after the photoresist is developed, in the manufacture of the stencil of the present invention.

The master tool is then developed. The photoresist that was exposed to the light is dissolved away, but the unexposed photoresist is not affected by the developing process and remains affixed to the bottom of the grooves. Thus, after developing, the master tool contains a layer of non-conductive photoresist only at the bottom of the grooves. The latter situation is illustrated in FIG. 15, which shows photoresist 59 at the bottom of the grooves of master tool 53.

Figure 16:
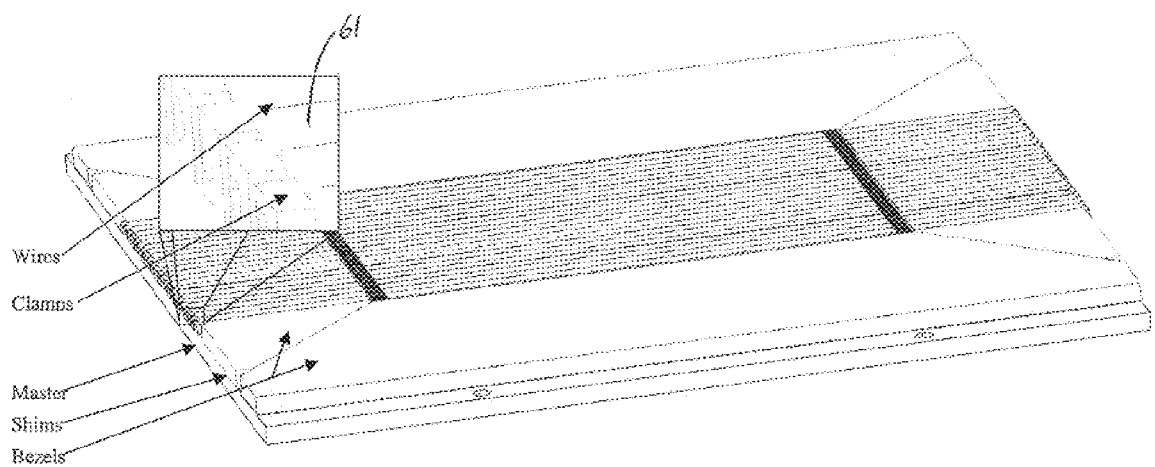
FIG. 16 provides a perspective view showing the placement of wires across the master tool, in the manufacture of the stencil of the present invention.

Next, fine small-diameter stainless steel wires are placed across the master tool, as shown in FIG. 16. Wires 61 extend from one side of the assembly to another, and therefore extend across two opposing bezels, as well as across the master tool itself. The wires are held taut by the clamps at either end of the assembly. Preferably, the wires are electroless nickel plated. But the invention is not limited by the diameter or composition of the wires.

Figure 17:
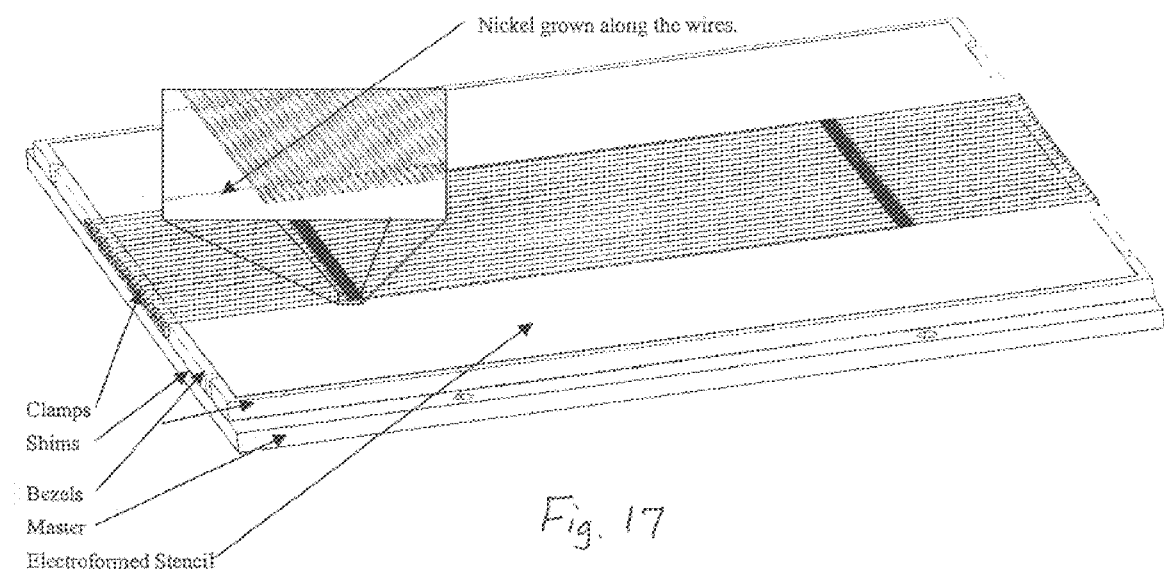
FIG. 17 provides a perspective view illustrating the electroforming of the stencil ok the present invention, on top of the master tool.

The electroformed stencil is then grown on top of the master tool, using an electroplating process, symbolized by FIG. 17. Preferably the material used for electroplating is nickel or enhanced nickel alloy. Because the photoresist coating the bottom of the grooves is non-conductive, the surfaces coated by the photoresist are not plated over. In other words, electroplated material accumulates on top of, and on the side walls of, the grooves of the master tool, but not along the bottom of the grooves. Thus, the electroplated material defines the U-shaped members described above. By definition, these U-shaped members mate with the walls defining the grooves.

FIG. 17 also symbolizes the fact that the electroplated material also surrounds the wires. The wires internally reinforce the finished stencil, and help to produce an integrally formed product. The electroplated material thereby forms bridge portions which link one U-shaped member with the next.

Figure 18:
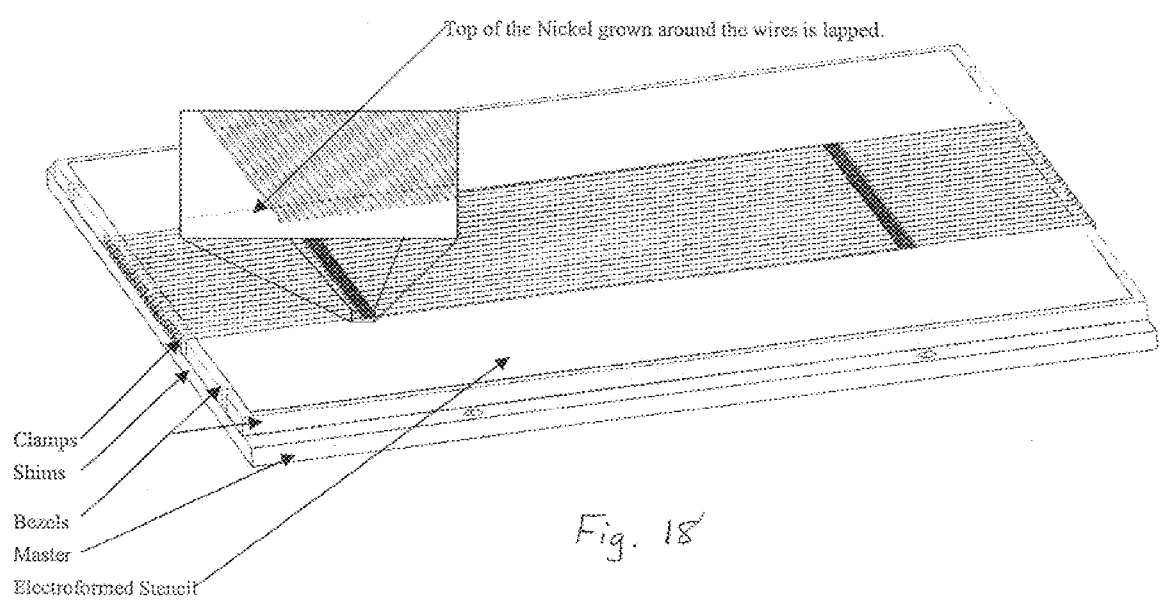
FIG. 18 provides a perspective view showing the lapping of the top of the electroformed stencil of the present invention.

The final step, illustrated in FIG. 18, is to lap the top of the stencil to make it flat. The lapping step compensates for non-uniformity of the electroplating, and removes the bumps where the electroforming around the wire is higher than the top surface of the U-shaped members. It is desirable that the top surface be flat, to facilitate the use of the squeegee in applying the cermet paste. The stencil is then removed from the assembly and mounted to a screen frame (not shown).

Both nickel and enhanced nickel alloy can be used for the manufacture of the stencil. When the enhanced nickel alloy is used, the tensile strength of the stencil is increased by about 55–65%, the hardness is increased by about 50–75%, and the modulus of elasticity is increased by about 26%.

In making the high-density circuit of the present invention, one uses an unfired ceramic substrate. The stencil makes it possible to deposit a controlled amount of cermet paste in the grooves, without pressing the paste forcibly into the substrate, and with virtually perfect precision. After the cermet material has been deposited, as described above, the ceramic is fired, in a known manner, both to cure the ceramic, and to make the cermet conductive. The result is a cured grooved ceramic substrate having a conductive material firmly bonded to the bottom of each of the grooves. Only one firing step is needed.

The width of each groove, formed in the substrate, in the process of the present invention, can be as small as about 87 microns. The pitch of the pattern of grooves, i.e. the center-to-center distance between adjacent grooves can be as small as about 150 microns, or even as small as about 127 microns. For a substrate with grooves having a width of 100 microns, and a 150-micron spacing, there will be about 169 grooves per inch.

The invention is also applicable to circuits having a much lower density of conductors. For example, one could use the present invention to make a product having as few as 10 lines per inch, in which case the grooves could be about 0.060 inches wide. Even at this relatively coarse spacing, conventional methods of laying down conductors are inferior to that of the present invention.

In the product made by the process described above, it becomes feasible to fill each groove only partially with the cermet material, simply by proper design of the stencil. This feature is important when the voltages to be applied to the conductors are relatively high, and it is important to isolate each conductor from its neighbor. Such isolation is best accomplished by filling the grooves only partially, so that the walls defining the grooves are relatively tall compared to the thickness of the cermet material. In the preferred embodiment, the height of the cermet material is about 0.1–0.6 times the height of the groove. In another preferred embodiment, the height of the cermet material is less than half the height of the groove.

The present invention has the important advantage that the conductors formed in the product made as described above have significantly lower resistivity than those of embedded circuits of the prior art. The reason for the lower resistivity is that the thicknesses of the conductors can be made much thicker than with the prior screen printing art, and this design thickness is precisely controlled by controlling the size of the side walls of the U-shaped members of the stencil. The present method makes it possible to place relatively thick conductors, having controlled and uniform thicknesses, at the bottom of the grooves of the substrate. Moreover, this uniformity applies not only within each conductor line, but also from one line to the next. The result is a product having overall greater uniformity and lowered resistivity.

The lowered resistivity of the product of the present invention means that one can use a less expensive material to achieve the same performance that required a more expensive material in the prior art. For example, it is known to use gold, instead of silver, as the conductive material, because gold has a lower electrical resistance than silver. The present invention makes it possible to use silver and other less expensive cermet metals, while obtaining the performance previously available only with gold.

The invention also has the advantage that virtually perfect registration of the conductors with the grooves is automatic, due to the fact that both the substrate and the stencil are formed from the same master tool.

Another advantage of the present invention is the elimination of the need to clean off residual cermet material from a die. In the prior art, wherein one first places the cermet on a flat ceramic substrate that is pressed into the die to form the grooves and walls, it is necessary to clean the residual cermet from the die after each use. The present process eliminates this step; the stencil can be used repeatedly, without cleaning, to apply cermet paste to pre-formed substrates.

Still another advantage of the invention is reduction in manufacturing costs. Conductive cermet material is expensive. The present invention substantially reduces waste of cermet material, and since the alignment of circuit lines with the substrate is guaranteed to be virtually perfect, alignment errors are essentially eliminated. Thus, it is unlikely that the process will yield poorly manufactured parts that have to be discarded.

In the description given above, the circuit consisted of a series of straight, parallel lines. The circuit could instead comprise circular lines, or a combination of straight and circular lines. The same techniques would apply if some of the lines were not straight.

Throughout this specification, it has been emphasized that the electroform and the stencil are made from the same master tool. It should be understood that the electroform and stencil can be made from different tools which are replications of the same master tool. Thus, the term "same master tool" should be interpreted to include exact replications.

The invention can be modified in various ways which will be apparent to the reader skilled in the art. Such modifications should be considered within the spirit and scope of the following claims.

What is claimed is:

1. A method of making a high-density circuit, comprising:
   a) providing a master tool having walls and grooves which define a desired circuit pattern,
   b) creating an electroform by electroplating over the master tool, wherein the electroform includes a plurality of tongues and grooves corresponding to the grooves and walls of the master tool,
   c) pressing the electroform into a ceramic substrate to form a pattern of grooves and walls in the substrate,
   d) creating a stencil by electroforming a plurality of U-shaped members over a tool having a same pattern of walls and grooves as the master tool, and placing the stencil over the substrate, wherein the U-shaped members fit over the walls of the substrate and wherein the U-shaped members are open near a bottom of the grooves,
   e) applying a cermet paste over the stencil, such that the cermet paste fills a space at the bottom of the grooves, and such that the paste also fills spaces between the U-shaped members,
   f) removing the stencil from the substrate, so as to leave the substrate with cermet paste deposited in the grooves of the substrate, and
   g) firing the substrate with the cermet paste therein.

2. The method of claim 1, wherein the method is performed with an unfired substrate, wherein step (g) comprises a first firing of the substrate.

3. The method of claim 1, wherein the U-shaped members have side walls, and wherein the method includes the step of determining a length of the side walls of the U-shaped members such that said side walls do not extend to a bottom of the grooves in the substrate, when the stencil is placed over the substrate.

4. The method of claim 1, wherein the fired cermet paste forms conductors, and wherein the method further comprises choosing the length of the side walls of the U-shaped members such that a height of the conductors in the grooves is less than half the height of the wall of the groove.

5. The method of claim 1, wherein the fired cermet paste forms conductors, and wherein the method further comprises choosing the length of the side walls of the U-shaped members such that a height of the conductors in the grooves is in a range of about 0.1–0.6 times the height of the wall of the groove.

6. The method of claim 1, wherein the stencil is made by a method comprising the steps of:
   h) depositing a photoresist on a bottom of the grooves of a tool having a same pattern of walls and grooves as the master tool, and
   i) electroforming a material onto the tool of step (h), wherein electroformed material covers the walls of said tool, and wherein no electroformed material is deposited on the photoresist, wherein the electroformed material has the shape of a plurality of elongated U-shaped members which mate with the walls of said tool.

7. The method of claim 6, wherein step (h) is followed by arranging a wire across the grooves, wherein the electroforming of step (i) is performed over the wire, and wherein the wire becomes embedded in the electroformed material.

8. The method of claim 7, wherein the U-shaped members have a top defined by a cross-piece of the "U", the method further comprising lapping the tops of the U-shaped members to remove excess electroformed material, such that the U-shaped members together define a flat surface.

9. The method of claim 6, wherein step (h) is performed by dip coating the tool in photoresist, exposing the tool to collimated light, such that walls of the grooves in the tool are exposed to light but such that the bottoms of the grooves in the tool are not exposed to light, and developing the photoresist so as to dissolve away the photoresist that was exposed to the light.

10. A method of making a high-density circuit, comprising:

a) providing a master tool having walls and grooves which define a desired circuit pattern, b) forming a pattern of grooves in a ceramic substrate, the pattern being substantially identical to the pattern of walls and grooves in the master tool, c) creating a stencil from a tool having a same pattern of walls and grooves as the master tool, wherein the stencil mates with the ceramic substrate, the stencil allowing access to a bottom of the grooves of the substrate, and pressing the stencil onto the substrate, d) applying a cermet paste into the stencil in sufficient quantity that the cermet paste flows into the bottom of the grooves of the substrate, and e) removing the stencil from the substrate, wherein the substrate is left with the cermet paste deposited at the bottom of the grooves.

11. The method of claim 10, wherein steps (a) through (e) are performed while the ceramic substrate is unfired, the method further comprising the step of firing the substrate, so as to convert the cermet paste into a conductor.

12. The method of claim 11, wherein the stencil is created by forming a plurality of U-shaped members which mate with the walls of the master tool, the U-shaped members having side walls, and wherein the method includes the step of determining a length of the side walls of the U-shaped members such that said side walls do not extend to a bottom of the grooves in the substrate, when the stencil is mated with the substrate.

13. The method of claim 12, further comprising choosing the length of the side walls of the U-shaped members such that a height of the conductor in the grooves is less than half the height of the wall of the groove.

14. The method of claim 12, further comprising choosing the length of the side walls of the U-shaped members such that a height of the conductor in the grooves is in a range of about 0.1–0.6 times the height of the wall of the groove.

15. The method of claim 10, wherein the stencil is made by a method comprising the steps of:

f) depositing a photoresist on a bottom of the grooves of a tool having a same pattern of walls and grooves as the master tool, and g) electroforming a material onto said tool, wherein electroformed material covers the walls of the tool, and wherein no electroformed material is deposited on the photoresist, wherein the electroformed material has the shape of a plurality of elongated U-shaped members which mate with the walls of the master tool.

16. The method of claim 15, wherein step (f) is followed by arranging a wire across the grooves, wherein the electroforming of step (g) is performed over the wire, and wherein the wire becomes embedded in the electroformed material.

17. The method of claim 16, wherein the U-shaped members have a top defined by a cross-piece of the "U", the method further comprising lapping the tops of the U-shaped members to remove excess electroformed material, such that the U-shaped members together define a flat surface.

18. A method of making a stencil for use in manufacturing a high-density electronic circuit, comprising:

a) providing a master tool having a pattern of walls and grooves, each of the grooves having a bottom, b) depositing a photoresist on the bottom of the grooves, and c) electroforming a material onto the master tool, wherein electroformed material covers the walls, and wherein no electroformed material is deposited on the photoresist, wherein the electroformed material has the shape of a plurality of elongated U-shaped members which mate with the walls of the master tool.

19. The method of claim 18, wherein step (b) is performed by dip coating the tool in photoresist, exposing the tool to collimated light, such that walls of the grooves in the tool are exposed to light but such that the bottoms of the grooves in the tool are not exposed to light, and developing the photoresist so as to dissolve away the photoresist that was exposed to the light.

20. The method of claim 18, wherein step (a) is followed by arranging a wire across the grooves, wherein the electroforming of step (c) is performed over the wire, and wherein the wire becomes embedded in the electroformed material.

21. The method of claim 18, wherein the U-shaped members have a top defined by a cross-piece of the "U", the method further comprising lapping the tops of the U-shaped members to remove excess electroformed material, such that the U-shaped members together define a flat surface.

22. A method of making a high-density circuit, comprising:

a) providing a master tool having walls and grooves which define a desired circuit pattern, b) forming a pattern of grooves in a ceramic substrate, the pattern being substantially identical to the pattern of walls and grooves in the master tool, c) creating a stencil from a tool having a same pattern of walls and grooves as the master tool, wherein the stencil mates with the ceramic substrate, the stencil allowing access to a bottom of the grooves of the substrate, and pressing the stencil onto the substrate, d) applying a cermet paste into the stencil in sufficient quantity that the cermet paste flows into the bottom of the grooves of the substrate, e) removing the stencil from the substrate, wherein the stencil has a dimension which determines an amount of cermet paste which remains when the stencil is removed, wherein the substrate is left with a predetermined amount of cermet paste deposited at the bottom of the grooves, and f) firing the substrate with the cermet paste therein so as to convert the cermet paste to a conductor, wherein the conductor has a height, and wherein the height of the conductor in the grooves is in a range of about 0.1–0.6 times the height of the wall of the groove.

23. The high-density circuit made according to the method of claim 22.

* * * * *